(12) United States Patent
Shepard

(10) Patent No.: US 8,526,217 B2
(45) Date of Patent: *Sep. 3, 2013

(54) LOW-COMPLEXITY ELECTRONIC CIRCUIT AND METHODS OF FORMING THE SAME

(71) Applicant: Daniel Shepard, North Billerica, MA (US)

(72) Inventor: Daniel Shepard, North Billerica, MA (US)

(73) Assignee: Contour Semiconductor, Inc., Billerica, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/692,638

(22) Filed: Dec. 3, 2012

(65) Prior Publication Data

US 2013/0114328 A1 May 9, 2013

Related U.S. Application Data

(63) Continuation of application No. 12/417,245, filed on Apr. 2, 2009, now Pat. No. 8,351,238.

(60) Provisional application No. 61/123,612, filed on Apr. 10, 2008, provisional application No. 61/124,071, filed on Apr. 14, 2008, provisional application No. 61/124,065, filed on Apr. 14, 2008.

(51) Int. Cl.
*G11C 11/00* (2006.01)

(52) U.S. Cl.
USPC ............ 365/148; 365/158; 365/171; 365/173

(58) Field of Classification Search
USPC ....................... 365/46, 71, 100, 148, 159, 163
See application file for complete search history.

(56) References Cited

U.S. PATENT DOCUMENTS

| | | | | |
|---|---|---|---|---|
| 4,442,507 A | * | 4/1984 | Roesner | 365/100 |
| 4,772,886 A | * | 9/1988 | Hasegawa | 348/82 |
| 4,884,238 A | * | 11/1989 | Lee et al. | 365/105 |
| 7,859,896 B2 | * | 12/2010 | Kurotsuchi et al. | 365/163 |

* cited by examiner

*Primary Examiner* — Pho M Luu
*Assistant Examiner* — Thao Bui
(74) *Attorney, Agent, or Firm* — Bingham McCutchen LLP

(57) ABSTRACT

An electronic circuit such as a latch or a sequencer includes a plurality of transistors, all of the transistors being either NMOS transistors or PMOS transistors, and dissipates less than or approximately the same amount of power as an equivalent CMOS circuit.

20 Claims, 7 Drawing Sheets

LOW-COMPLEXITY ELECTRONIC CIRCUIT AND METHODS OF FORMING THE SAME

CROSS-REFERENCE TO RELATED APPLICATIONS

This application is a continuation of U.S. patent application Ser. No. 12/417,245, filed on Apr. 2, 2009, which claims priority to and the benefit of U.S. Provisional Patent Application No. 61/123,612, filed Apr. 10, 2008, U.S. Provisional Patent Application No. 61/124,071, filed Apr. 14, 2008, and U.S. Provisional Patent Application No. 61/124,065, filed Apr. 14, 2008. The entire disclosure of each of these applications is incorporated by reference herein.

TECHNICAL FIELD

In various embodiments, the present invention relates to electronic circuits such as latches and sequencers, and in particular to electronic circuits fabricated with a minimum number of different component types.

BACKGROUND

The prior art is replete with different versions of electronic circuits that perform specific functions, and their sizes and complexities vary widely. One general design principle for simple circuits is minimizing the total number of constituent parts (i.e., components) utilized to form the circuit. As most, if not all, electronic circuits are eventually implemented in tangible form as, e.g., solid-state integrated circuit chips, costs ordinarily diminish as the number of components decreases, as the chip area decreases concomitantly. However, with individual transistor gate lengths being reduced to 0.1 μm and below, reducing the total number of process steps required to fabricate the chip can be more important than reducing the absolute number of components thereon. Moreover, regardless of the number of devices in a circuit, the number of process steps necessary to fabricate the circuit may be minimized by limiting the number of different types of devices therein.

FIGS. 1A and 1B depict different designs for a simple inverter circuit. FIG. 1A depicts an inverter designed in a typical n-type metal-oxide-semiconductor (NMOS) transistor technology, i.e., utilizing only NMOS field-effect transistors (FETs). Transistor Q1 is in a pull-up configuration and operates in a manner similar to that of a simple pull-up resistor. When input A is in a low logic state, transistor Q2 is turned off, the output $\overline{A}$ is dominated by the signal voltage (depicted as +) through pull-up transistor Q1, and the output $\overline{A}$ is placed in a high logic state. Conversely, when the input A is in a high logic state, transistor Q2 is turned on, the output $\overline{A}$ is dominated by the signal voltage through transistor Q2 to ground, and the output $\overline{A}$ is placed in a low logic state. An important shortcoming of this NMOS-only inverter circuit is its significant steady-state power dissipation through pull-up transistor Q1 when the input A is high and the output $\overline{A}$ is low. The power consumption (and associated heat dissipation) of more complex circuits incorporating NMOS-only inverters may be prohibitive.

Complementary metal-oxide-semiconductor (CMOS) technology, utilizing both NMOS and p-type metal-oxide-semiconductor (PMOS) transistors, has been used to combat the above-described power dissipation issue. FIG. 1B depicts an inverter designed in a typical CMOS technology. PMOS transistor Q1 is in a pull-up configuration and operates in a "complementary" fashion to NMOS transistor Q2. When the input A is in a low logic state, transistor Q1 is turned on, transistor Q2 is turned off, and the output $\overline{A}$ is pulled high through transistor Q1. Conversely, when input A is in a high logic state, transistor Q1 is turned off, transistor Q2 is turned on, and the output $\overline{A}$ is pulled low through transistor Q2 to ground. Since PMOS transistor Q1 and NMOS transistor Q2 are never both turned on at the same time, a steady current is never drawn through transistors Q1 and Q2, and power dissipation is minimized. However, this advantage comes with a price. Since fabrication of NMOS and PMOS transistors must be performed separately (as they include, e.g., different source, drain, and well doping, as well as the associated photolithography steps), the processing cost of CMOS circuits is generally much higher.

As described above, typical low-complexity circuit designs (where the term "low-complexity" is utilized herein to refer to designs utilizing a minimum number of different types of constituent components) suffer from, e.g., high power dissipation. Unfortunately, strategies for reducing power dissipation typically involve the introduction of higher complexity, thus increasing the processing and overall costs of integrated-circuit chips. Accordingly, there exists a need for electronic circuit designs that both minimize power consumption and utilize a minimal number of different component types.

SUMMARY

Embodiments of the present invention include electronic circuit blocks, e.g., latches and sequencers, designed with low complexity. Such circuit blocks are preferably designed with only one type of transistor (i.e., either NMOS or PMOS), and may also include at least one type of simple current-steering device (e.g., diodes, field emitters, etc.). The current-steering device may be a transistor (typically of the same one type) that is configured as a diode, e.g, has its drain and gate connected. The circuit blocks incorporate the low power dissipation of CMOS technology while minimizing processing (and thus overall manufacturing) costs by limiting the total number of constituent component types.

In an aspect, embodiments of the invention feature an electronic circuit including a plurality of transistors, all of the transistors being either NMOS transistors or PMOS transistors. The electronic circuit dissipates less than or approximately the same amount of power as an equivalent CMOS circuit. The electronic circuit may include or consist essentially of a latch. The number of transistors in the latch may range from five to seven, and the latch may include a reset input. The latch may include up to three current-steering devices. The latch may include or consist essentially of twelve transistors and a plurality of inputs and outputs. The electronic circuit may include a plurality of current-steering devices, each of which may include or consist essentially of a diode.

The electronic circuit may include or consist essentially of a sequencer, which may include a decoder and be addressable. The decoder may include or consist essentially of an array of diodes (or other current-steering devices). The sequencer may be non-addressable. The sequencer may include or consist essentially of a plurality of stages, and all but one of the stages may be substantially identical. At least one stage may include a transistor configured to function as a capacitor.

In another aspect, embodiments of the invention feature a memory device including or consisting essentially of a memory array and control circuitry electrically connected to the memory array. The memory array includes or consists essentially of a plurality of generally parallel rows and a plurality of generally parallel columns intersecting the plurality of rows. A memory cell including or consisting essentially of a resistive-change material is proximate an intersection of a row and a column. The control circuitry includes or consists essentially of a plurality of transistors. All of the transistors of the control circuitry are either PMOS transistors or NMOS transistors. The resistive-change material may include or consist of a chalcogenide alloy, which may include germanium, antimony, and/or tellurium. The control circuitry may include or consist essentially of at least one of a latch or a sequencer. The memory cell may include a current-steering element, which may be in series with the resistive-change material. The power dissipation of the memory device may be less than or substantially equal to the power dissipation of an equivalent memory device including a CMOS latch and a CMOS sequencer.

In yet another aspect, embodiments of the invention feature a method of forming an electronic device. A plurality of transistors is provided, all of the transistors being either NMOS transistors or PMOS transistors. The electronic circuit dissipates less than or approximately the same amount of power as an equivalent CMOS circuit.

In another aspect, embodiments of the invention feature a method of forming an electronic device including performing a plurality of process steps to form one of a latch or a sequencer. The latch or sequencer includes or comprises essentially of a plurality of transistors. The number of process steps is less than the number of process steps required to fabricate an equivalent CMOS circuit. The latch or sequencer may include or consist essentially of only either NMOS or PMOS transistors.

In a further aspect, embodiments of the invention feature a method of forming a memory device including providing a memory array, a latch, and a sequencer. The memory array includes or consists essentially of a plurality of generally parallel rows and a plurality of generally parallel columns intersecting the plurality of rows. The latch and the sequencer each include or consist essentially of a plurality of transistors. All of the transistors of the latch and the sequencer are either PMOS transistors or NMOS transistors. The power dissipation of the memory device may be less than or substantially equal to the power dissipation of an equivalent memory device including a CMOS latch and a CMOS sequencer.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 2:
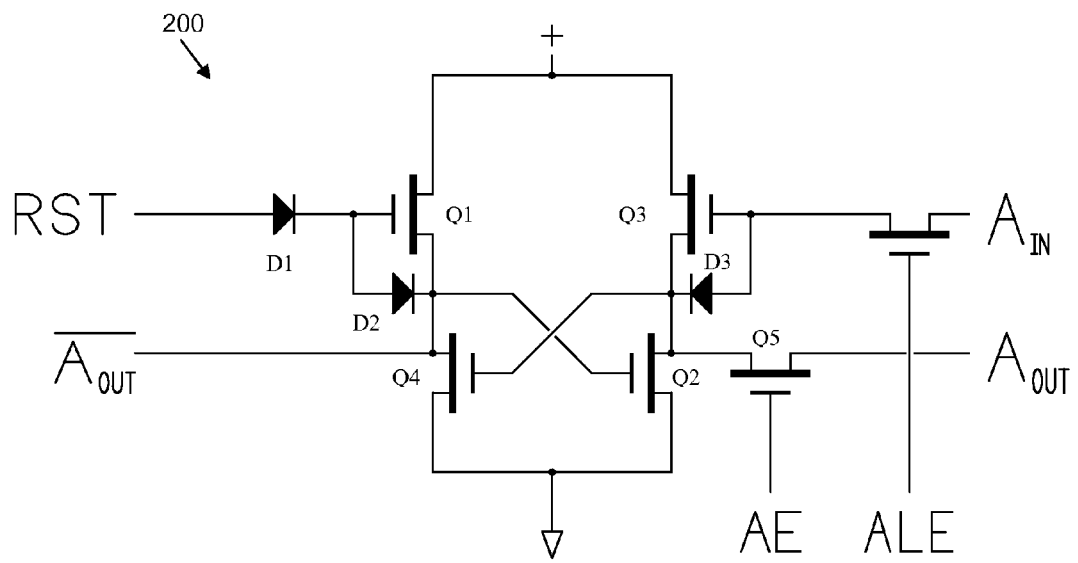
FIGS. 2 and 3 are circuit diagrams of latch circuits designed in accordance with embodiments of the invention.

FIG. 2 depicts a latch circuit 200 (all of the transistors of which are NMOS transistors) designed according to embodiments of the present invention. Operation of latch 200 commences with a high voltage level applied to the reset input (depicted as RST). The voltage passes through diode (or other rectifier) D1 and places a charge on the gate of transistor Q1; the voltage is large enough to turn on transistor Q1 while allowing for the voltage drop across diode D1. The dropped voltage also passes through diode D2 and places a charge on the gate of transistor Q2, turning it on as well. The drain of transistor Q2 is thus pulled to ground along with the gate of transistor Q4 (turning it off) and the gate of transistor Q3 (turning it off).

Following the application of voltage to the reset input, charge is trapped on the gate of transistor Q1. Transistor Q1 is on and pulls the gate of transistor Q2 high; transistor Q2 is turned on and pulls the gates of transistors Q3 and Q4 low (turning both transistors Q3 and Q4 off). With transistor Q1 on and transistor Q4 off, the output $\overline{A_{OUT}}$ is pulled high, and with transistor Q2 on and transistor Q3 off, the output $A_{OUT}$ is pulled low (through transistor Q5 when input A Enable (AE) is high).

After a reset, A Load Enable (ALE) may be brought high to allow input $A_{IN}$ to pass into the latch. If $A_{IN}$ is low, the gate of transistor Q3 is brought low (the state it is typically in following a reset), and, since diode D3 blocks the low $A_{IN}$ signal from entering the circuit, no change takes place: the reset places the latch in the same state as loading a low input through $A_{IN}$. If, on the other hand, $A_{IN}$ is high when ALE is brought high, the high $A_{IN}$ signal will pass through diode D3, place a charge on the gate of transistor Q3, pass through diode D3, and place a charge on the gate of transistor Q4 (thus turning on transistors Q3 and Q4). The drain of transistor Q4 is therefore pulled to ground along with the gate of transistor Q1 (through diode D2, thus turning off transistor Q1) and the gate of Q2 (thus turning off transistor Q2). The output switch controlled by AE (including transistor Q5) is shown on only the $A_{OUT}$ output, but could be included on both outputs ($A_{OUT}$ and $\overline{A_{OUT}}$) or omitted entirely.

Figure 1A:
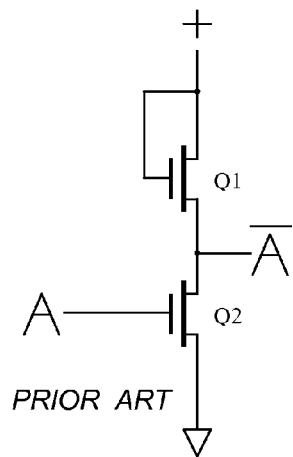
FIGS. 1A and 1B are circuit diagrams of prior-art inverters utilizing NMOS technology (FIG. 1A) and CMOS technology (FIG. 1B)
Figure 1B:
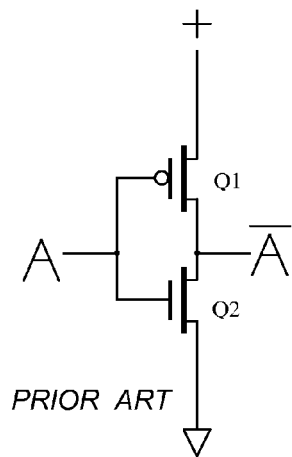
Figure 3:
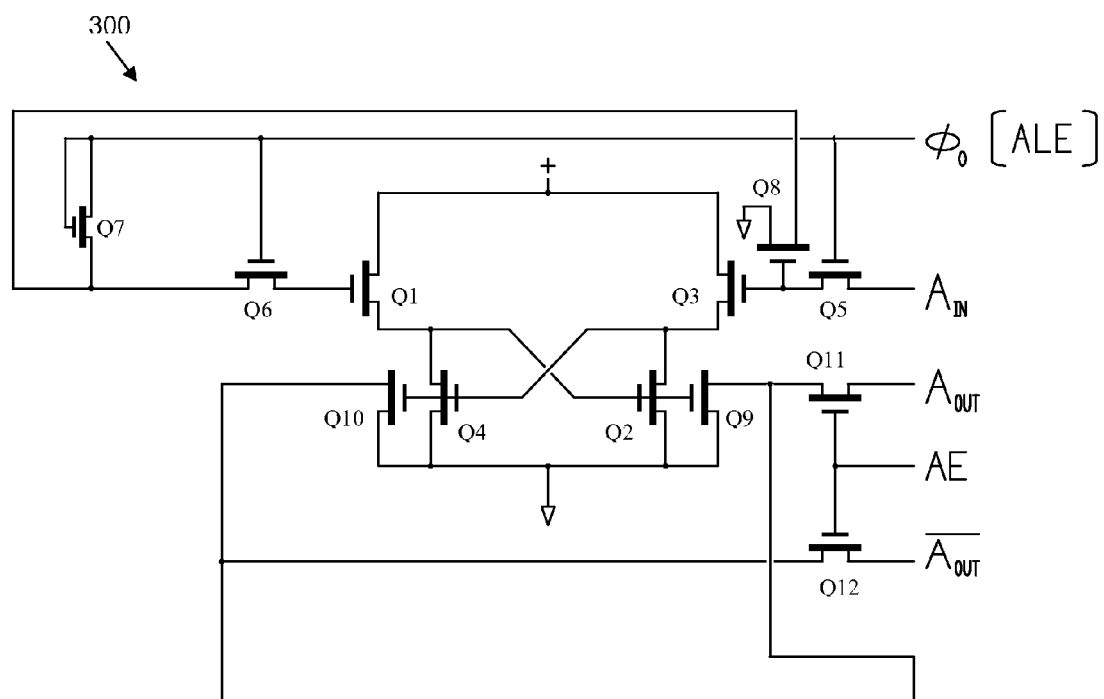

FIG. 3 depicts a latch circuit 300 (all of the transistors of which are NMOS transistors) designed according to embodiments of the present invention in which the reset input (RST in FIG. 2) is eliminated. Operation of latch 300 commences with an input voltage level from the $A_{IN}$ input which, when ALE is raised high, passes through transistor Q5 and places a charge on the gate of transistor Q3 (as well as on the gate of transistor Q8). Transistors Q1, Q2, Q3, and Q4 operate as described above with reference to latch 200, except that the charge placed on the gate of transistor Q1 is also controlled by the ALE input with transistor Q6. The applied voltage is derived from input $A_{IN}$, but is inverted by the NMOS inverter (similar to that depicted in FIG. 1A) implemented with pull-up transistor Q7 and transistor Q8. If $A_{IN}$ is high, a steady current is drawn through pull-up transistor Q7 only while input signal ALE is high; thus, power dissipation is much reduced compared to the power dissipated during operation of the inverter of FIG. 1A.

With the elimination of the reset input, the need for diodes D1, D2 and D3 (shown in FIG. 2) is also eliminated. To reduce loading issues when driving inputs to subsequent circuits, transistors Q9 and Q10 mirror the states of transistors Q2 and Q4, respectively, and drive the outputs $A_{OUT}$ and $\overline{A_{OUT}}$. In accordance with various embodiments of the invention, the outputs $A_{OUT}$ and $\overline{A_{OUT}}$ of latch 300 may be switched (i.e., controlled by AE through transistors Q11 and Q12, respectively) or unswitched. The embodiment featuring unswitched outputs is represented in FIG. 3 by the output connections lacking transistor switches extending to the bottom edge of FIG. 3.

Variations on latches (and other circuit blocks) fabricated in accordance with embodiments of the present invention will be apparent to those skilled in the art. The output stage of latch 300 may additionally include pull-up transistors as in latch 200; the gates of such pull-up transistors may be wired in parallel to the gates of transistors Q1 and Q3 (just as pull-down output transistors Q10 and Q9 are wired in parallel to transistors Q4 and Q2, respectively).

Figure 4:
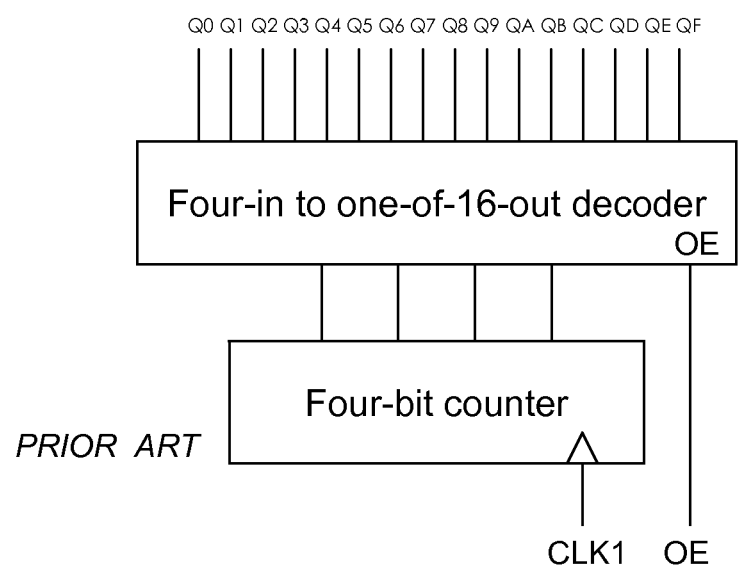
FIG. 4 is a schematic of a sequencer circuit found in the prior art.

FIG. 4 depicts a prior-art sequencer, which, as depicted, is in essence a counter with a decoded output. All of the outputs Q0-QF are in a low logic state except for the output corresponding to the count on the counter, which goes high when the output enable input (OE) goes high. Pulsing CLK1 advances the decoder to the next output in the sequence.

Figure 5:
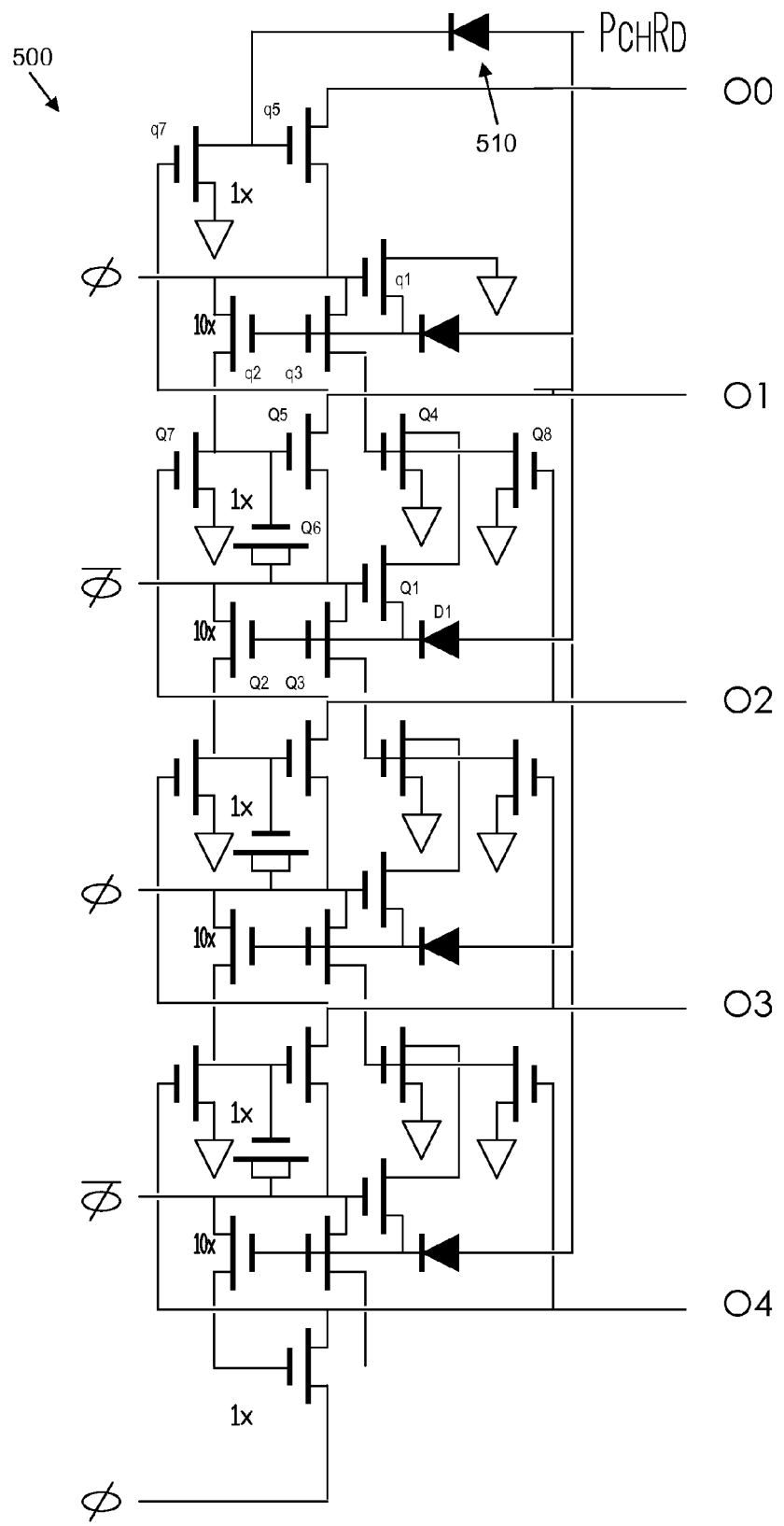
FIG. 5 is a circuit diagram of a sequencer circuit designed in accordance with embodiments of the present invention.
Figure 6:
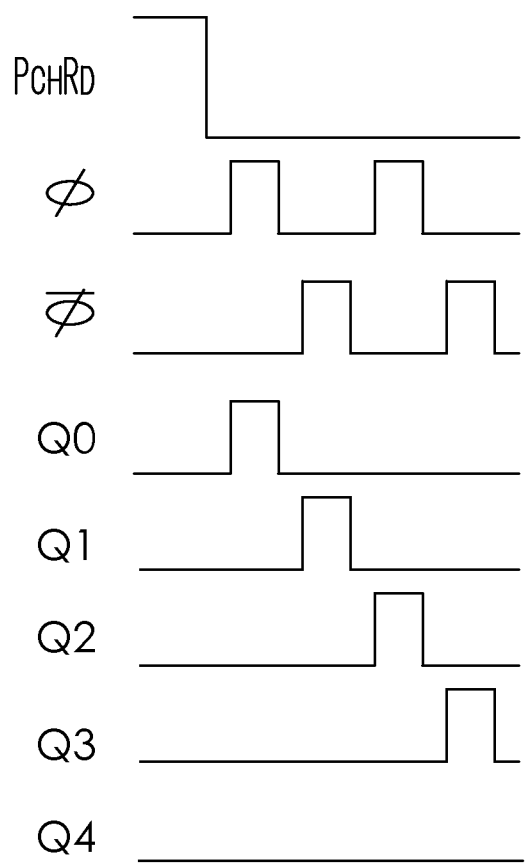
FIG. 6 is an exemplary timing diagram of the operation of sequencer circuits designed in accordance with embodiments of the present invention.

FIG. 5 depicts a five-stage sequencer circuit 500 (all of the transistors of which are NMOS transistors) designed according to embodiments of the present invention. Sequencer 500 includes or consists essentially of four identical stages, corresponding to outputs O1-O4, and a stage zero (corresponding to output O0) that differs slightly. Only the component devices of stage zero and stage one (corresponding to output O1) have been labeled for legibility, but stages two, three, and four are preferably identical to stage one. FIG. 6 depicts a simplified timing diagram of the operation of sequencer 500.

Initialization of sequencer 500 is accomplished with both inputs ($\Phi$ and $\overline{\Phi}$) of the two-phase clock low and with the outputs O0-O4 all being discharged to ground (this discharges the gates of transistors Q7 and Q8). A logic-high voltage is then pulsed on the precharge input (labeled $P_{CH}R_D$), which passes the voltage through the diode D1 of each stage and places a charge on the gates of transistors Q2 and Q3. Note that the voltage must be large enough to turn on transistors Q2 and Q3 while allowing for the voltage drop across diode D1. Since inputs $\Phi$ and $\overline{\Phi}$ must be low when $P_{CH}R_D$ is high, a low logic signal passes through transistors Q2 and Q3, thus turning off transistors Q5 and Q4 of the subsequent stage, respectively. Following the initialization, the gates of transistors Q2 and Q3 will be turned on and holding a charge, while the gates of transistors Q7, Q5, Q4, Q8, Q6, and Q1 will be discharged and turned off. Note, however, that the diode 510 connected to $P_{CH}R_D$ enables a charge to be placed on the gate of transistor q5 of stage zero.

Following the above-described initialization sequence, operation of sequencer 500 continues with a pulse on clock input $\Phi$, which is connected to all of the even-numbered stages (whereas $\overline{\Phi}$ is connected to all of the odd-numbered stages). In stage zero, because the gate of transistor q5 is charged, the $\Phi$ clock pulse passes through transistor q5 and appears on output O0. Also, unique to stage zero, the drain of transistor q1 is connected to ground, so that when clock input $\Phi$ goes high, transistor q1 conducts and the gates of transistors q2 and q3 are discharged to ground and turned off. However, before transistor q2 turns off, the logic-high signal of $\Phi$ will have passed through transistor q2 and placed a charge on transistor Q5 of the subsequent stage (i.e., stage one). Then, when transistor q2 is turned off, the charge on transistor Q5 is trapped and cannot discharge back through transistor q2 when $\Phi$ goes low.

At the same time, transistor q3 will likewise trap charge on the gate of transistor Q4 of the subsequent stage. In a preferred embodiment, the gate capacitance of transistor q2 is larger than that of transistor Q5, thus enabling transistor Q5 to change its charge more quickly than transistor q2 can be turned off. In another embodiment, this timing differential is enabled by increasing the conductivity of the trace to the gate of transistor Q5 relative to the conductivity of the gate-discharge trace of transistor q2.

Note that, for all other even stages (here stages two and four), transistor Q5 of the previous stage will be turned off and no pulse will pass to the outputs of these stages. Transistor Q5 will be high only in the stage for which the output is to be passed on the next clock pulse. That clock pulse will then place a charge on the gate of transistor Q5 of the subsequent stage, where it will be trapped by the gate of the transistor Q2 being discharged. Also, in all subsequent stages, the charge trapped on the gate of transistor Q4 will enable the drain of transistor Q1 to pass through transistor Q4 to ground. As a result, the gates of transistors Q2 and Q3 will be discharged through transistor Q1 on only the stage for which the clock pulse is being passed to the output. Furthermore, since $\Phi$ and $\overline{\Phi}$ are never both logic high at the same time, a race condition is avoided. (In the race condition, the gates of transistors Q2 and Q4 of the subsequent stage would be discharged when transistor Q4 of the active stage is charged.) Transistors Q7 and Q8 discharge the gates of transistors Q5 and Q4, respectively, when the output of the subsequent stage pulses high.

Having a transistor q6 (analogous to transistors Q6 in stages one through four that are configured to function as capacitors) to boost the charge on the gate of transistor q5 is not necessary in stage zero—the logic-high voltage level of $P_{CH}R_D$ may be set to a voltage sufficient to charge the gate of transistor q5 to a level enabling the full voltage of $\Phi$ to be passed through q5 to O0. In an embodiment, the $P_{CH}R_D$ signal has a lower amplitude, and a transistor q6 in stage zero (not pictured) is included to boost the charge on the gate of transistor q5, thus enabling the full $\Phi$ signal to be passed to output O0.

Sequencer 500 may be used for stepping through a series of consecutive addresses, or to step through blocks of addresses (where further decoding of the addresses within the block is performed with additional decoding logic). Sequencers in accordance with embodiments of the present invention may be utilized with "tree decoders," where they may be utilized as an initial decoding stage that selects blocks of addresses in a desired order. In another embodiment, a sequencer is used within the structure of a tree decoder beyond the point where an address is resolved to a particular word line or bit line of, e.g., a memory array. The sequencer may then sequentially access addresses along the particular word line or bit line. Such a configuration provides an improvement in access time for a memory device. The ability to sequentially step to the next address or block of addresses eliminates the requirement for loading an address or a full address, respectfully, and the access time is correspondingly reduced by this eliminated address load time.

In an embodiment, the discharge of transistors Q7 and Q8 during the initialization step is accomplished by adding to each stage an additional transistor (herein referred to as Q9, not shown) that has its gate connected to $P_{CH}R_D$ and its source and drain connected between the stage's output O and ground. Then, when $P_{CH}R_D$ goes high, Q9 is turned on, and transistors Q7 and Q8 and the output O are discharged to ground.

Figure 7:
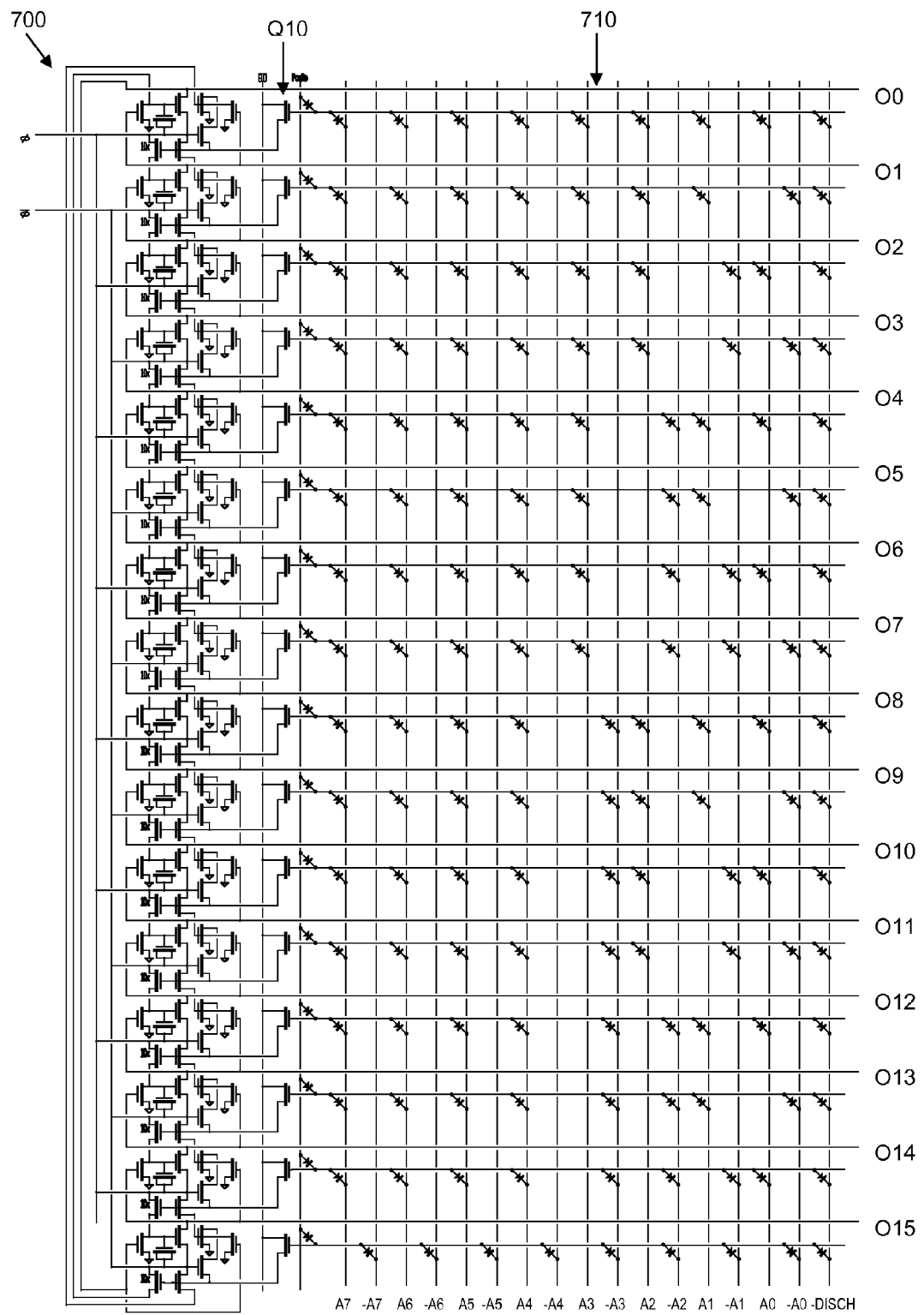
FIG. 7 is a circuit diagram of an addressable sequencer circuit designed in accordance with embodiments of the present invention.

FIG. 7 depicts an addressable sequencer 700 (all of the transistors of which are NMOS transistors) designed according to embodiments of the present invention. The addressable sequencer 700 is very similar to the non-addressable sequencer 500 depicted in FIG. 5, except that the bottom end of addressable sequencer 700 wraps back to the top, and the staring point is set by the diode address decoder 710 that fills the right side of FIG. 7. Initialization of addressable sequencer 700 commences with both inputs of the two-phase clock ($\Phi$ and $\overline{\Phi}$) low and with $P_{CH}R_D$ putting a charge (through a diode) onto the gate of transistor Q10 (i.e., a transistor added to each stage of addressable sequencer 700 compared to each stage of sequencer 500). Transistor Q10 is charged up for every stage and the input $\overline{GO}$ is brought high, resulting in the gates of transistors Q2 and Q3 of each stage being charged high. Next, while keeping $\overline{GO}$ high, via the application of complementary address input signals, the gates of all but one of the transistors Q10 are discharged through diode decoder 710 (thus turning them off). The remaining transistor Q10 corresponds to the "selected" stage where the sequencing will begin. Then, with only the selected transistor Q10 still turned on, $\overline{GO}$ is brought low, thus discharging the gates of the transistors Q2 and Q3 in the selected stage through its enabled transistor Q10. In an embodiment, as shown in FIG. 7, a discharge signal line –DSCH may be included that enables the discharge of the gates of all of the transistors Q10.

The circuits of FIGS. 2, 3, 5, and 7 are depicted as including only NMOS transistors, but they may be fabricated with only PMOS transistors and operated with negative voltages (with respect to the ground voltage). In a preferred embodiment, each of the transistors is substantially identical to the others except for a size parameter, e.g., length and/or width. For example, transistors may have different widths in order to control and conduct different amounts of current, but may be fabricated (preferably all in parallel) by substantially the same process otherwise. Moreover, the diodes (e.g., D1) depicted in these figures may be replaced with other rectifying devices (e.g., vacuum tubes) or other current-steering elements such as field emitters. Latches, sequencers, and other circuits fabricated in accordance with embodiments of the present invention preferably dissipate approximately the same amount of or less power than equivalent circuits fabricated in CMOS technology (i.e., equivalent circuits including both NMOS and PMOS transistors).

Figure 8:
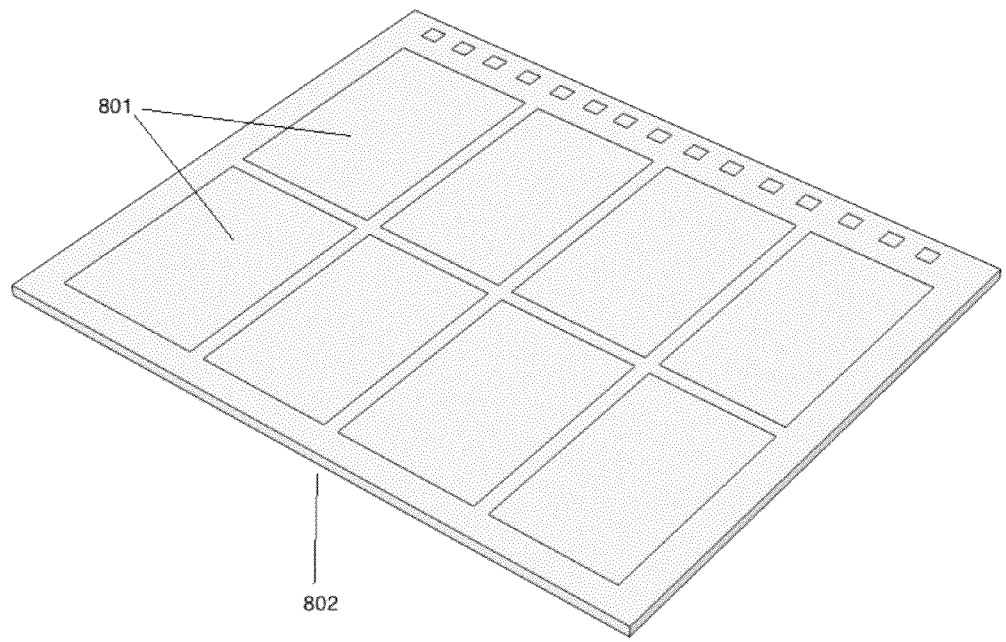
FIG. 8 is an illustration of a device containing a memory array composed of a plurality of sub-arrays in accordance with embodiments of the present invention.

Embodiments of the present invention may be utilized in memory devices that include cross-point memory arrays, e.g., memory arrays such as those described in U.S. Pat. No. 5,889,694 or U.S. patent application Ser. Nos. 11/729,423 or 11/926,778, the entire disclosure of each of which is hereby incorporated by reference. For example, latches in accordance with various embodiments may be used for holding loaded addresses, previously read data or data to be written, control information, or for other purposes. The memory array and its control circuitry (including, e.g., latches and/or sequencers fabricated in accordance with embodiments of the invention) may be implemented with only a single type (e.g., NMOS or PMOS) of transistor. As shown in FIG. 8, the memory array may be one of a plurality of "tiles" or sub-arrays 801 of a larger memory array 802, or may be a layer (or portion of a layer) in a three-dimensional memory array that may be fabricated in accordance with U.S. Pat. No. 6,956,757 to Shepard, the entire disclosure of which is hereby incorporated by reference. The storage cells of the memory array may include at least one transistor, field emitter, diode, four-layer diode, gated four-layer diode (thrystor), and/or any other device that conducts current asymmetrically at a given applied voltage. The storage elements may be fuses, anti-fuses, and/or devices including a resistive-change material, which may be a phase-change material such as a chalcogenide (or other material capable of programmably exhibiting one of two or more resistance values). The resistive-change material may be placed in series with a diode (or other rectifier or current-steering device) at a memory cell location. The resistive-change material may include or consist essentially of an alloy of germanium, antimony, and tellurium (GST). The combination of a single type of transistor for the peripheral memory logic with the high-density structure of a resistive-change diode cross-point memory cell has very favorable economics as a consequence of the fewer number of processing steps required.

The storage element may even include a field-emitter programming element whose resistance and/or volume is changeable and programmable, e.g., a device described in U.S. patent application Ser. Nos. 11/707,739 or 12/339,696, the entire disclosures of which are hereby incorporated by reference. The storage cells and/or storage elements may be present at or near one or more intersections between a row and a column, and may even be present at all such intersections. In an embodiment, various intersections may even include different types of storage cells or elements. In another embodiment, the present invention may be comprised by a memory device in which one or more layers of storage cells and/or storage elements are present in the device and the memory arrays of any layer can comprise one or more sub-arrays or tiles.

Figure 9:
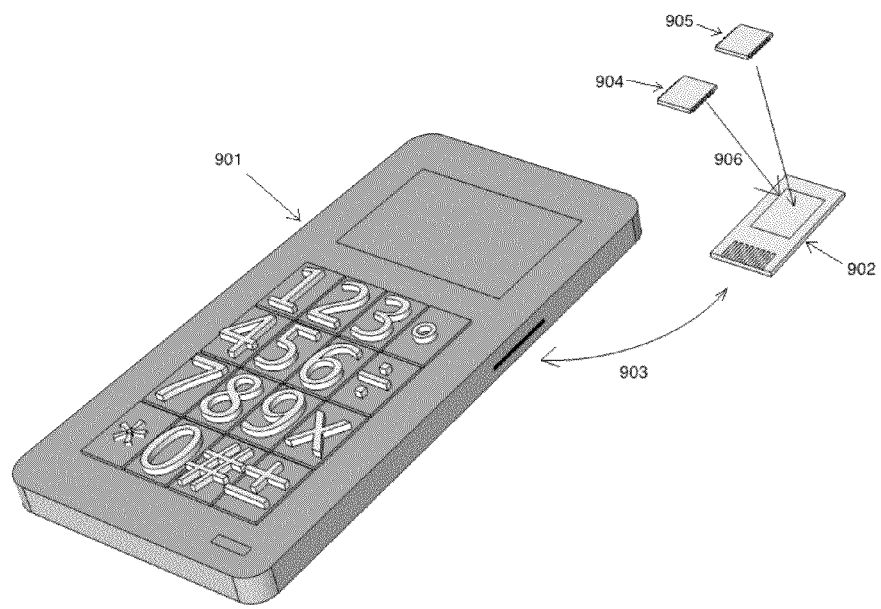
FIG. 9 is an illustration of a device utilizing embodiments of the present invention.

Memory devices constructed according to the present invention will find applicability in such areas as storing digital text, digital books, digital music, digital audio, digital photography (wherein one or more digital still images can be stored including sequences of digital images), digital video, and digital cartography (wherein one or more digital maps can be stored), as well as any combinations thereof. As shown in FIG. 9, these devices 904 can be embedded (as indicated by arrow 906) within a package 902 or removable or removable and interchangeable as indicated by arrow 903) among devices 901. They can be packaged in any variety of industry standard form factors 902 including Compact Flash, Secure Digital, MultiMedia Cards, PCMCIA Cards, Memory Stick, any of a large variety of integrated circuit packages 904 including Ball Grid Arrays, Dual In-Line Packages (DIP's), SOIC's, PLCC, TQFP's and the like, as well as in custom designed packages. These packages can contain just the memory chip 904, multiple memory chips, one or more memory chips along with a controller 905 or other logic devices or other storage devices such as PLD's, PLA's, micro-controllers, microprocessors, controller chips or chip-sets or other custom or standard circuitry.

Memory devices constructed according to embodiments of the present invention will also find applicability in such areas as solid state disk drives (SSD). These SSDs may include one or more memory devices and may also be combined with a controller device (including, e.g., control circuitry as described above).

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A memory device comprising:
    a memory array comprising a plurality of generally parallel rows and a plurality of generally parallel columns intersecting the plurality of rows;
    a memory cell proximate an intersection of a row and a column, the memory cell comprising a resistive-change material; and
    control circuitry electrically connected to the memory array, the control circuitry comprising a plurality of MOS transistors,
    wherein (i) all of the MOS transistors of the control circuitry are of the same type, the type selected from the group consisting of PMOS and NMOS, and (ii) the control circuitry comprises at least one latch.

2. The memory device of claim 1, wherein the resistive-change material comprises a chalcogenide alloy.

3. The memory device of claim 2, wherein the chalcogenide alloy comprises at least one of germanium, antimony, or tellurium.

4. The memory device of claim 1, wherein the memory cell comprises a current-steering element.

5. The memory device of claim 4, wherein the resistive-change material and current steering element are connected in series.

6. The memory device of claim 4, wherein the current-steering element comprises a diode.

7. The memory device of claim 1, wherein the control circuitry comprises a sequencer.

8. The memory device of claim 1, wherein the control circuitry comprises a sequencer and a decoder, wherein the sequencer is addressable.

9. The memory device of claim 8, wherein the decoder comprises an array of diodes.

10. The memory device of claim 1, wherein the memory device is contained within a package.

11. The memory device of claim 10, wherein the package is removable to another device.

12. The memory device of claim 10, wherein the package is embedded within another device.

13. The memory device of claim 10, wherein the package has an industry standard form factor.

14. The memory device of claim 13, wherein the industry standard form factor is selected from the group consisting of Compact Flash, Secure Digital, MultiMedia Card, PCMCIA Card, and Memory Stick.

15. The memory device of claim 10, wherein the package comprises at least one additional device therewithin.

16. The memory device of claim 15, wherein the at least one additional device is selected from the group consisting of a memory device, a controller, a logic device, a micro-controller, a microprocessor, a controller chip, and a chip-set.

17. The memory device of claim 10, wherein the package has a type which is selected from the group consisting of Ball Grid Array, Dual In-Line Package (DIP), SOIC, PLCC, or TQFP.

18. The memory device of claim 1, wherein the memory device comprises at least one of (i) one or more layers of storage cells or (ii) one or more layers of storage elements.

19. The memory device of claim 1, wherein the memory device comprises one or more sub-arrays or tiles.

20. The memory device of claim 1, wherein the memory cells store one or more pieces of digital information selected from the group consisting of text, books, music, audio, photography, video, cartography, and maps.

* * * * *